United States Patent
Fischer et al.

(10) Patent No.: US 9,645,163 B2
(45) Date of Patent: May 9, 2017

(54) SENSOR WITH A SINGLE ELECTRICAL CARRIER MEANS

(75) Inventors: Thomas Fischer, Darmstadt (DE); Stefan Günthner, Frankfurt (DE); Dietmar Huber, Dietzenbach (DE); Jakob Schillinger, Gaimersheim (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 264 days.

(21) Appl. No.: 14/240,503

(22) PCT Filed: Aug. 24, 2012

(86) PCT No.: PCT/EP2012/066503
§ 371 (c)(1),
(2), (4) Date: Feb. 24, 2014

(87) PCT Pub. No.: WO2013/026923
PCT Pub. Date: Feb. 28, 2013

(65) Prior Publication Data
US 2014/0202246 A1    Jul. 24, 2014

(30) Foreign Application Priority Data

Aug. 24, 2011 (DE) .......... 10 2011 081 505
Aug. 24, 2011 (DE) .......... 10 2011 081 512

(51) Int. Cl.
*G01P 15/08* (2006.01)
*G01P 1/02* (2006.01)
*B81C 1/00* (2006.01)

(52) U.S. Cl.
CPC .......... *G01P 1/023* (2013.01); *B81C 1/0023* (2013.01)

(58) Field of Classification Search
None
See application file for complete search history.

(56) References Cited

U.S. PATENT DOCUMENTS

| | | |
|---|---|---|
| 5,804,880 A | 9/1998 | Mathew |
| 5,948,991 A | 9/1999 | Nomura |
| 6,428,357 B1 * | 8/2002 | Dolinshek ............. H01R 43/18 29/856 |

(Continued)

FOREIGN PATENT DOCUMENTS

| | | |
|---|---|---|
| CN | 101690424 A | 3/1916 |
| DE | 197 35 904 A1 | 5/1998 |

(Continued)

OTHER PUBLICATIONS

PCT International Search Report—Apr. 12, 2012.
German Examination Report Feb. 28, 2013.

*Primary Examiner* — Paul West
*Assistant Examiner* — Mark A Shabman
(74) *Attorney, Agent, or Firm* — Brinks Gilson & Lione

(57) ABSTRACT

A sensor having at least one sensor element (1), at least one signal processing element (2), and a housing (7) which has at least one fastening means. An electrical interface is provided for electrically connecting the sensor. The sensor has an electrically and mechanically connecting carrier means (4) on which the at least one sensor element (1) and the signal processing element (2) are arranged and are electrically connected to the carrier means. The carrier means (4) is also at least electrically connected to the electrical interface.

8 Claims, 4 Drawing Sheets

(56) References Cited

U.S. PATENT DOCUMENTS

2004/0055783 A1* 3/2004 Masuda .............. H01L 23/3107
                                                    174/252
2010/0109654 A1* 5/2010 Schneider ................ G01D 5/20
                                                    324/207.2

FOREIGN PATENT DOCUMENTS

| DE | 10 2004 019 428 A1 | 8/2005 |
| DE | 10 2006 030 133 A1 | 2/2007 |
| DE | 10 2005 053 682 A1 | 5/2007 |
| DE | 10 2007 032 142 A1 | 1/2009 |
| EP | 1 396 886 A1 | 3/2004 |
| EP | 2 211 598 A2 | 7/2010 |

\* cited by examiner

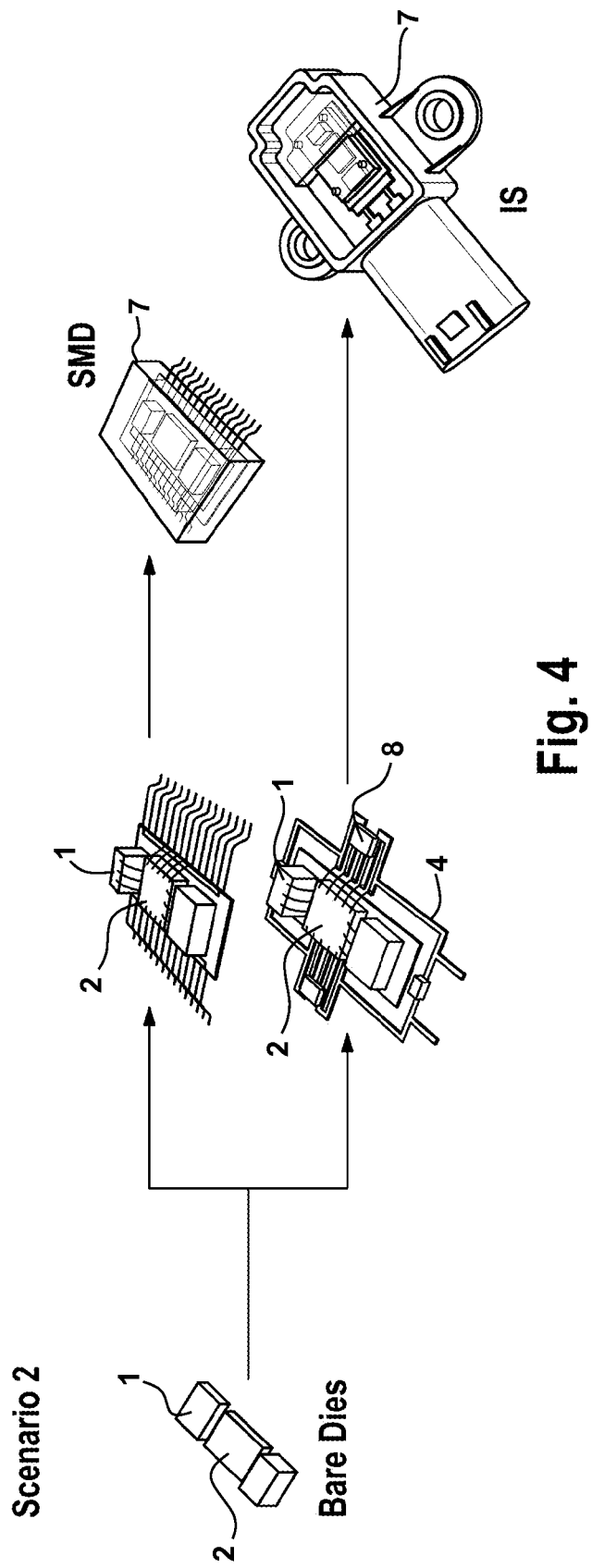

SENSOR WITH A SINGLE ELECTRICAL CARRIER MEANS

CROSS REFERENCE TO RELATED APPLICATIONS

This application claims priority to German Patent Application Nos. 10 2011 081 505.8, filed Aug. 24, 2011; 10 2011 081 512.0, filed on Aug. 24, 2011; and PCT/EP2012/066503, filed Aug. 24, 2012.

FIELD OF THE INVENTION

The invention relates to a sensor and also to the use of the sensor in motor vehicles.

BACKGROUND OF THE INVENTION

Micromechanical sensor elements, or MEMS sensor elements, and application-specific integrated circuits, or ASICs, which are initially in the form of unpackaged semiconductor components, are usually mounted as so-called "bare dies" by the manufacturer to form complete inertial sensors in the form of a component which can be soldered or a component which can be surface-mounted or in the form of a so-called "surface mounted device" (SMD) which is protected from environmental influences by a housing and with which contact is made on the outside.

SMDs of this kind can be soldered directly onto a printed circuit board, or "PCB", in a control device (ECU, ACU) or in a separate housing of a satellite sensor.

SUMMARY AND INTRODUCTORY DESCRIPTION OF THE INVENTION

The present invention is based on the object of proposing a cost-effective and/or compact sensor.

According to the invention, this object is achieved by the sensor as described and claimed herein.

The sensor of the present invention preferably has a single carrier means.

The carrier means is preferably in the form of a leadframe or a PCB as a carrier means. As an alternative, the carrier means is preferably in the form of a printed circuit board, or "PCB".

An electrical interface is preferably understood to mean a plug, and alternatively preferably a cable connection or cable outlet.

It is preferred for the at least one sensor element and the associated signal processing element to be arranged on the carrier means in each case as unpackaged semiconductor components. An unpackaged semiconductor component is preferably understood to mean a component of which the functional structure is formed from a semiconductor material and which does not have its own housing. Unpackaged is understood to mean, for example, "silicon-packaged" or packaged on a "wafer plane" or a "bare die".

It is preferred for the sensor to have a transfer mold housing which completely or at least partially surrounds the at least one sensor element and the signal processing element and the carrier means. In particular, the at least one sensor element and the signal processing element are at least partially covered by an encapsulation compound or a "glob top", within the transfer mold housing, in this case.

The transfer mold housing is preferably completely or at least partially surrounded by an overmold housing.

It is preferred for the at least one sensor element to be in the form of an inertial sensor element.

The sensor is preferably in the form of a satellite sensor, in particular in the form of a motor vehicle sensor.

A transfer mold housing is preferably understood to mean a transfer molded housing or a premold housing.

An overmold housing is preferably understood to mean an injection molded housing or an overmold housing or a housing which formed of an epoxy.

The leadframe preferably has at least one mounting island on which at least the sensor element and the signal processing element are arranged.

The at least one sensor element is preferably in the form of a micromechanical sensor element, in particular in the form of a micromechanical inertial sensor element.

The sensor is preferably designed such that the overmold housing has two parts, a prefabricated housing part into which the carrier means and the components which are connected to said carrier means are inserted, and a second part with which said prefabricated housing part is closed by means of overmolding or an overmold housing. Said two housing parts particularly preferably are formed of an injection molding material or overmolding material or epoxy.

The unpackaged semiconductor components are preferably fastened or arranged on the carrier means by means of an adhesive.

It is expedient for the at least one sensor element and the signal processing element and/or optionally further electrical components to be electrically connected at least to the carrier means and/or to one another by means of bonding or wire bonding.

As an alternative, the at least one sensor element and the signal processing element and/or optionally further electrical components, in particular in the form of "bare dies", are preferably fixed and electrically contact-connected by flip-chip technology. To this end, either solder balls, copper pillars and/or solder pads are particularly preferably applied to the top face of the "bare dies". Said bare dies, or unpackaged semiconductor components, are then, for example, placed upside-down on the leadframe or the printed circuit board and are soldered by reflow or hot steam.

The sensor preferably has one or more additional electrical components, such as at least one resistor and/or at least one capacitor and/or at least one inductor and/or at least one further integrated circuit and/or at least one varistor.

The housing of the sensor, in particular the outer housing or overmold housing, preferably has one or two or several fastening devices which is/are particularly preferably designed such that the sensor can be fastened by means of a screw connection.

One or more "press fit pins" preferably make electrical contact with the electrical carrier means. In this case, the region in which this contact-connection process is carried out is cut out from the overmold housing and/or the transfer mold housing.

As an alternative, contact is preferably made by solder pins which are composed of a conductive material which can be soldered. Said pins can have any desired cross section. Said pins are typically round or square. Said pins are soldered to the PCB so-called through-hole technology (THT technology).

It is preferred for electrical contact to be made with the carrier means by means of at least one welded-on pin, in particular by the electrical interface.

The PCB is preferably fixed in the satellite sensor by structural elements directly in the housing and cover (support pillars, ribs, latching hooks, etc.). As an alternative, it is possible to adhesively bond or screw-connect the PCB.

In order to provide protection against environmental influences, said housing is, after installation of the PCB into the housing of the satellite sensor, expediently closed by means of an encapsulation compound or by a cover which is composed of metallic or nonmetallic material.

The invention also relates to the use of the sensor in motor vehicles.

In particular, the invention also relates to a production method for a sensor, said production method being advantageous and/or flexible. In this case, the electrically and mechanically connecting carrier means is initially populated with unpackaged semiconductor elements and optionally further electronic components.

The unpackaged semiconductor elements and the optional further electronic components are preferably directly encapsulated, so that they are arranged in a transfer mold housing. As an alternative, the unpackaged semiconductor elements and the optional further electronic components are preferably initially further covered by an encapsulation compound or "glob top" before the encapsulation with the transfer mold housing, said encapsulation compound then likewise being injection molded into the transfer mold housing. A sensor in the form of a component which can be soldered or a component which can be surface-mounted or in the form of a so-called "surface mounted device" (SMD) or a sensor in the form of a satellite sensor is then selectively generated/manufactured from these semi-manufactured sensors by means of an overmold encapsulation or an overmold housing and/or an additional prefabricated housing.

BRIEF DESCRIPTION OF THE DRAWINGS

In the drawings:

FIGS. 3 and 4 show schematic, exemplary illustrations of an exemplary production method for a sensor in accordance with the present invention.

FURTHER DESCRIPTION OF THE PRESENT INVENTION

Figure 1:
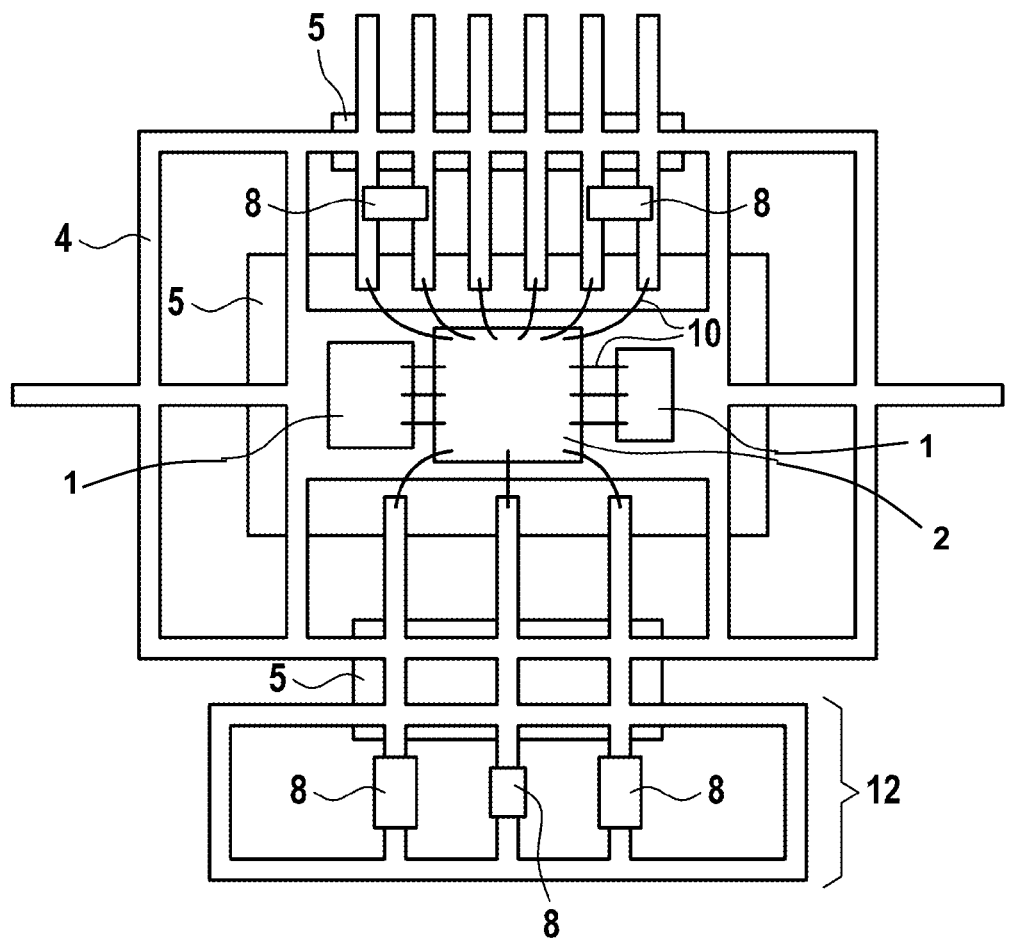
FIGS. 1 and 2a) and 2b) show schematic, exemplary illustrations of exemplary embodiments of the sensor in accordance with the present invention.
Figure 1:
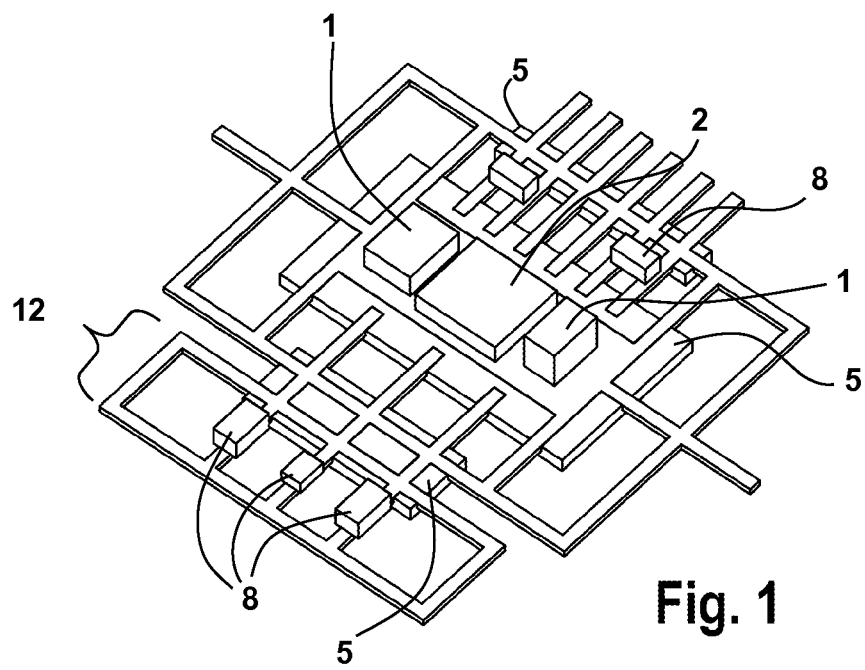

FIG. 1 shows a raw sensor from two perspectives, said sensor having a leadframe as carrier means 4. The sensor includes two adhesively bonded sensor elements 1 and a signal processing element 2 with which electrical contact is made by means of bonding wires 10 bonded to the leadframe 4. Sensor elements 1 and a signal processing element 2 are surrounded or accordingly injection molded by a transfer mold housing 5. The leadframe 4 includes two further encapsulations as transfer mold housings 5. Furthermore, the leadframe 4 is populated with additional electronic components 8, such as "R", "C", "IC", diodes or at least one varistor, for example.

Figure 2A:
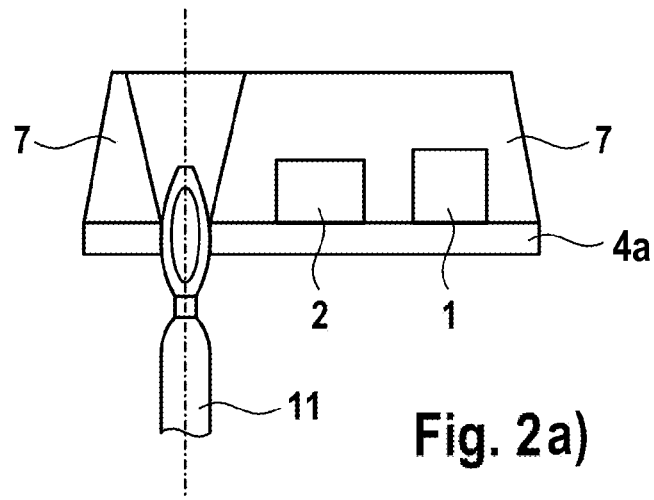
Figure 2B:
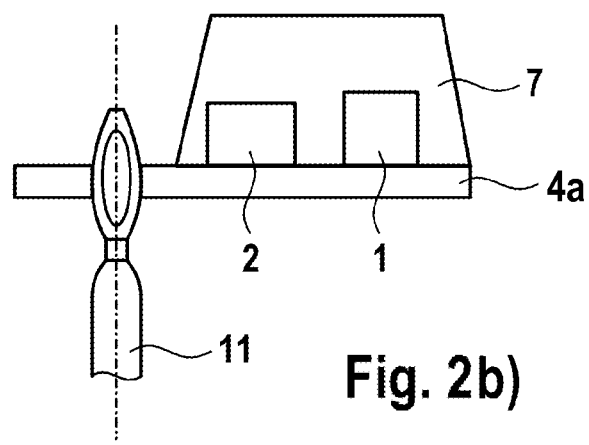

FIG. 2 shows an exemplary sensor in the form of a surface-mounted component or so-called "surface mounted device" (SMD). The sensor has a sensor element 1 and a signal processing element 2 which are arranged on the carrier means 4a, according to the example in the form of a printed circuit board or "PCB". Electrical contact is made with the printed circuit board 4a by means of press fit pins 11, wherein the contact region are cut out from the housing 7 of the sensor in the form of an overmold housing 7. In FIG. 2a), the overmold housing 7 has a recess/cutout in this contact-making region, in FIG. 2b) this contact-making region in arranged next to the overmold housing 7.

Figure 3:
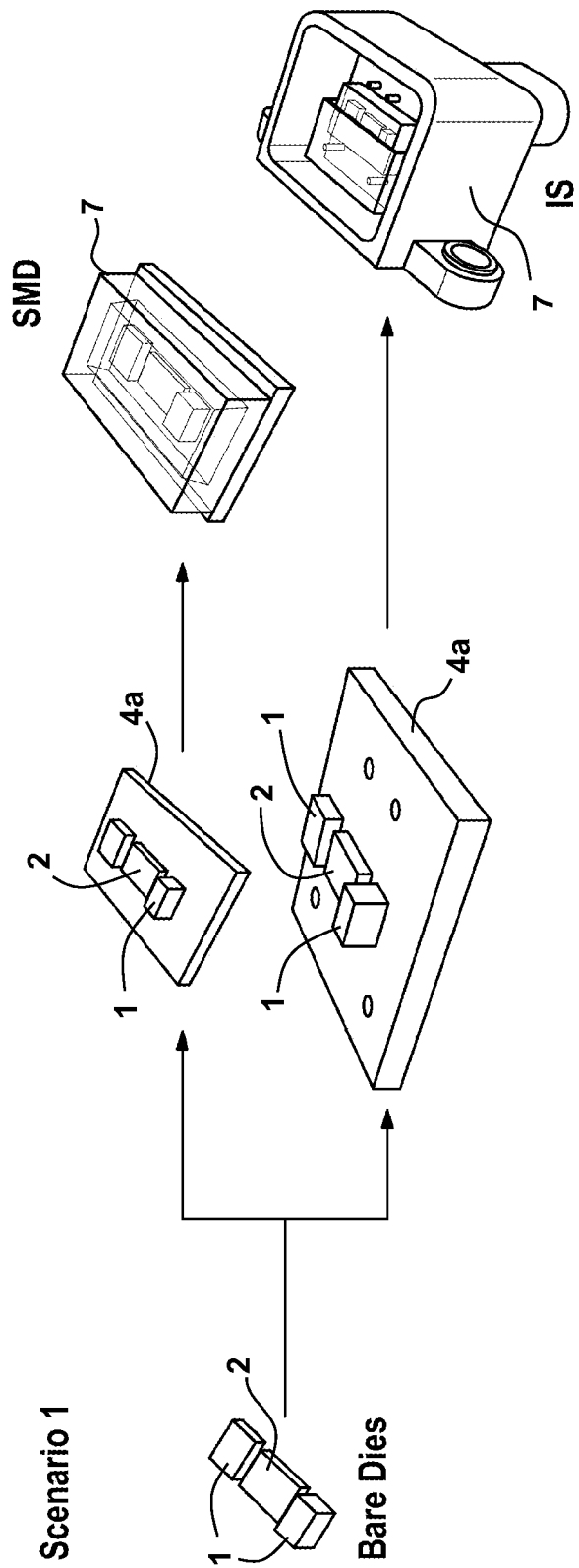

FIG. 3 shows an exemplary production method for the sensor in accordance with this invention. Instead of the conventional two packaging steps for constructing a satellite sensor, only one step is required—the "bare dies" are arranged/mounted on the printed circuit board 4a as the carrier means and contact is then made with the housing and said housing is formed. The construction of a separate SMD which then additionally would have to be connected to the carrier means and would take up space is dispensed with.

For PCB sensors and satellite sensors, the construction and connection technology of the bare dies and the flip-chip process is identical. Front-end equipment can equally be used for production.

The glob top and transfer mold manufacturing processes for protecting the bare dies are identical. The printed circuit board can be completely or partially encapsulated by transfer molding.

The modular production method illustrated in FIG. 4 preferably allows or comprises two main variants, as is schematically illustrated by way of example: "On-board" variant (SMD) illustrated in the upper portion of FIG. 4:

The populated leadframe 4 with the contact-connected bare dies is preferably protected by a glob top or casting compound and a subsequent transfer mold or a complete/post-encapsulation process, for example by means of epoxy. This produces an SMD, that is to say a component which can be surface mounted (surface mounted device), which is soldered directly onto the PCB, "printed circuit board", or electronic printed circuit board of a control device. Reflow soldering or hot-steam soldering are suitable soldering methods.

"Satellite" variant (IS) shown in the lower portion of FIG. 4:

The populated leadframe with the contact-connected bare dies is preferably protected by a glob top or casting compound and a subsequent transfer mold or a complete/post-encapsulation process, for example by means of epoxy.

The contact pins are welded to the leadframe beforehand or, as an alternative, a cable can be fitted by so-called crimping or beading.

The fastening parts can be inserted into the die and concomitantly encapsulated or subsequently introduced, for example by hot-embedding and/or ultrasound welding.

Three sub-variants are possible in accordance with the above:

a) The populated leadframe 4 is completely encapsulated by the housing.

b) The populated leadframe is partially encapsulated by an open housing and closed by a casting compound and/or cover. The cover can be composed of a metallic or nonmetallic material.

c) The populated leadframe is partially encapsulated by a holder (so-called carrier) which is composed of plastic, and then completely encapsulated by the housing.

The proposed method and its variants or the sensor produced using said method have the following advantages according to the example:

The processes of mounting, making contact and protecting the bare dies are identical for both variants.

Instead of the conventional two packaging steps for constructing the satellites (IS), only one step is required (bare die→satellite product). The construction of a separate SMD is dispensed with.

The construction and connection technology of the bare dies is identical, that is to say the same manufacturing devices (front-end equipment), for on-board and satellite solutions (SMD and IS).

The glob top and transfer mold manufacturing processes for protecting the bare dies are identical.

Passive elements without or with protection (glob top and transfer mold) can additionally be mounted on the leadframe, as schematically shown with reference to FIG. 1 by way of example.

Furthermore, any desired modular expansions of the leadframe are possible, these carrying further additional circuits, as schematically shown with reference to FIG. 1 by way of example. These can be further bare dies (MEMS, ASIC) or other components (R, C, IC, diodes, varistors, LEDs, etc.).

All modules can be designed without or with protection (glob top+transfer mold). If appropriately designed, only one mold tool protection is required for all of the modules.

While the above description constitutes the preferred embodiment of the present invention, it will be appreciated that the invention is susceptible to modification, variation and change without departing from the proper scope and fair meaning of the accompanying claims.

The invention claimed is:

1. A sensor comprising:
 at least one sensor element,
 at least one signal processing element,
 a housing which has at least one fastening means, and also an electrical interface for electrically connecting the sensor,
 the sensor has an electrically and mechanically connecting carrier means on which the at least one sensor element and the signal processing element are directly arranged on and are electrically connected to said carrier means, wherein the carrier means is also at least electrically connected to the electrical interface,
 the carrier means is in the form of a leadframe, and
 wherein the at least one sensor element and the signal processing element are arranged on the carrier means in the form of unpackaged semiconductor components as bare dies, wherein the unpackaged semiconductor components comprise a functional structure formed from a semiconductor material but that the semiconductor components do not have separate housings.

2. The sensor as claimed in claim 1, further comprising in that the sensor has a single carrier means.

3. The sensor as claimed in claim 1 further comprising the sensor has a transfer mold housing which completely or at least partially surrounds the at least one sensor element and the signal processing element and the carrier means.

4. The sensor as claimed in claim 3 further comprising the at least one sensor element and the signal processing element are at least partially covered by an encapsulation compound, within the transfer mold housing.

5. The sensor as claimed in claim 3 further comprising the transfer mold housing is completely or at least partially surrounded by an overmold housing.

6. The sensor as claimed in claim 1 further comprising the at least one sensor element is in the form of an inertial sensor element.

7. The sensor as claimed in claim 1 further comprising the sensor is in the form of a satellite sensor, and the sensor is in the form of a motor vehicle sensor.

8. The sensor as claimed in claim 1, wherein the leadframe entirely forms the carrier means.

* * * * *